US008582251B2

(12) United States Patent
Gao et al.

(10) Patent No.: US 8,582,251 B2
(45) Date of Patent: Nov. 12, 2013

(54) MAGNETIC SENSOR WITH NON-RECTANGULAR GEOMETRY

(75) Inventors: Kaizhong Gao, Eden Prairie, MN (US); Lei Wang, Maple Grove, MN (US); Jiaoming Qiu, St. Paul, MN (US); Yonghua Chen, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 15 days.

(21) Appl. No.: 12/727,670

(22) Filed: Mar. 19, 2010

(65) Prior Publication Data
US 2011/0051294 A1 Mar. 3, 2011

Related U.S. Application Data

(63) Continuation-in-part of application No. 12/547,832, filed on Aug. 26, 2009.

(51) Int. Cl.
*G11B 5/39* (2006.01)
(52) U.S. Cl.
USPC .................................. 360/324.12
(58) Field of Classification Search
USPC .................................. 360/324.12
See application file for complete search history.

(56) References Cited

U.S. PATENT DOCUMENTS

| | | | |
|---|---|---|---|
| 5,737,155 A * | 4/1998 | George et al. | 360/327.31 |
| 5,739,990 A | 4/1998 | Ravipati et al. | |
| 5,748,415 A * | 5/1998 | Christner et al. | 360/327 |
| 6,157,524 A * | 12/2000 | Nakazawa et al. | 360/324.12 |
| 6,426,853 B1 * | 7/2002 | Sakai et al. | 360/324.12 |
| 6,661,625 B1 * | 12/2003 | Sin et al. | 360/324.2 |
| 6,680,829 B2 | 1/2004 | Chen et al. | |
| 6,724,582 B2 * | 4/2004 | Funayama et al. | 360/324.1 |
| 6,980,403 B2 | 12/2005 | Hasegawa | |
| 7,075,761 B2 * | 7/2006 | Parker | 360/324.12 |
| 7,397,633 B2 | 7/2008 | Xue et al. | |
| 7,505,232 B2 | 3/2009 | Haginoya et al. | |
| 7,869,165 B2 | 1/2011 | Miyauchi et al. | |
| 2002/0012209 A1 * | 1/2002 | Ajiki et al. | 360/324.12 |
| 2002/0044389 A1 | 4/2002 | Seigler et al. | |
| 2002/0064006 A1 * | 5/2002 | Hasegawa | 360/324.12 |
| 2002/0085323 A1 * | 7/2002 | Smith et al. | 360/324.12 |
| 2002/0114111 A1 | 8/2002 | Zhu | |
| 2003/0002229 A1 * | 1/2003 | Pinarbasi | 360/324.2 |
| 2005/0063100 A1 * | 3/2005 | Kautzky et al. | 360/313 |
| 2005/0094470 A1 | 5/2005 | Ikarashi | |
| 2005/0248888 A1 | 11/2005 | Dieny et al. | |
| 2007/0139827 A1 | 6/2007 | Gao et al. | |

(Continued)

OTHER PUBLICATIONS

Tsiantos et al, "Thermal magnetization noise in submicrometer spin valve sensors" Journal of Applied Physics, May 15, 2003, pp. 8576-8578, vol. 93, No. 10, 2003 American Institute of Physics.
Final Office Action mailed Sep. 11, 2012 for U.S. Appl. No. 12/547,832.

*Primary Examiner* — Craig A. Renner
(74) *Attorney, Agent, or Firm* — Hall Estill Attorneys at Law

(57) ABSTRACT

Various embodiments generally relate to a magnetic sensor, and more specifically to a magnetoresistive read head sensor. In one such exemplary embodiment, a magnetic sensor comprises a sensor stack and magnetic bias elements positioned adjacent opposite sides of the sensor stack. At least one of the bias elements has a non-rectangular shape, such as substantially trapezoidal or parallelogram shapes having non-perpendicular corners.

16 Claims, 6 Drawing Sheets

(56) References Cited

U.S. PATENT DOCUMENTS

2007/0217086 A1* 9/2007 Matsubara et al. ...... 360/324.12
2011/0007426 A1* 1/2011 Qiu et al. ..................... 360/313
2011/0050211 A1* 3/2011 Gao et al. ..................... 360/324
2011/0051294 A1   3/2011 Gao et al.
2011/0134572 A1* 6/2011 Qiu et al. ..................... 360/313

* cited by examiner

MAGNETIC SENSOR WITH NON-RECTANGULAR GEOMETRY

CROSS-REFERENCE TO RELATED APPLICATION(S)

This is a continuation-in-part application of U.S. patent application Ser. No. 12/547,832, filed Aug. 26, 2009, entitled "TRAPEZOIDAL READER FOR ULTRA HIGH DENSITY MAGNETIC RECORDING."

SUMMARY

Various embodiments of a magnetic sensor comprises a sensor stack and magnetic bias elements positioned adjacent each side of the sensor stack. At least one bias element has non-rectangular shapes.

DETAILED DESCRIPTION

A concern in the performance of magnetoresistive read sensors is fluctuation of magnetization in the read sensor, which directly impacts the magnetic noise of the read sensor. There are three major components of noise that decrease the SN ratio of a reader: Shot noise, Johnson noise, and thermal magnetic noise. All are related to the RA product and become increasingly disruptive to the SN ratio as the reader area decreases in size. Shot noise results from random fluctuations in electron density in an electric current and is proportional to the current I, the band width $\Delta f$, and the resistance R. The noise power, $P_s$, in a resistor due to Shot noise in a resistor is: $P_s = f(I \Delta f \, RA/A)$.

Johnson noise results from thermal fluctuations in electron density in a conductor regardless of whether a current is flowing and is proportional to the temperature T, band width $\Delta f$, and the resistance R. The noise power $P_j$ in a resistor due to Johnson noise is: $P_j = f(T \Delta f \, RA/A)$.

Thermal magnetic noise results from thermally induced magnetic fluctuations in the sensing layers of the reader and is proportional to the temperature T; band width $\Delta f$; the reader bias field to the free ferromagnetic layer $H_{bias}$; the magnetic moment of the free layer $M_{sf}$; and the volume of the free layer, $V_{free}$. The noise power, $P_{mag}$, in a resistor due to thermal magnetic noise is: $P_{mag} = f(T \Delta f / H^2_{bias} M_{sf} V_{free})$.

The RA product of a CPP or TMR sensor is an intrinsic value depending on the material. As the sensor area decreases, the resistance as well as the Shot noise and Johnson noise levels increase. The thermal magnetic noise level varies inversely as the free layer volume of the sensor and also increases accordingly as the sensor area decreases. The resistance increase problem can be overcome with a shunt resistor, but the reader loses signal amplitude. From a reader performance standpoint, it is advantageous to maximize the reader area while maintaining a small reader footprint at the ABS.

RTN noise is an additional noise component to the reader outpoint signal. RTN noise originates from the existence of two remanent magnetization patterns in the sensor that are energetically close enough and have a low energy barrier such that thermal activation can cause oscillation between the two states. Each magnetization pattern (termed "C" state and "S" state) has a different resistance that adds noise to the sensor output signal. Thus there is an additional challenge to stabilize the "C" state or "S" state in addition to maximizing reader area while maintaining a small reader footprint at the ABS.

The reader disclosed herein reduces the above mentioned noise levels for a given recording geometry as well as permitting a higher playback amplitude.

Figure 1:
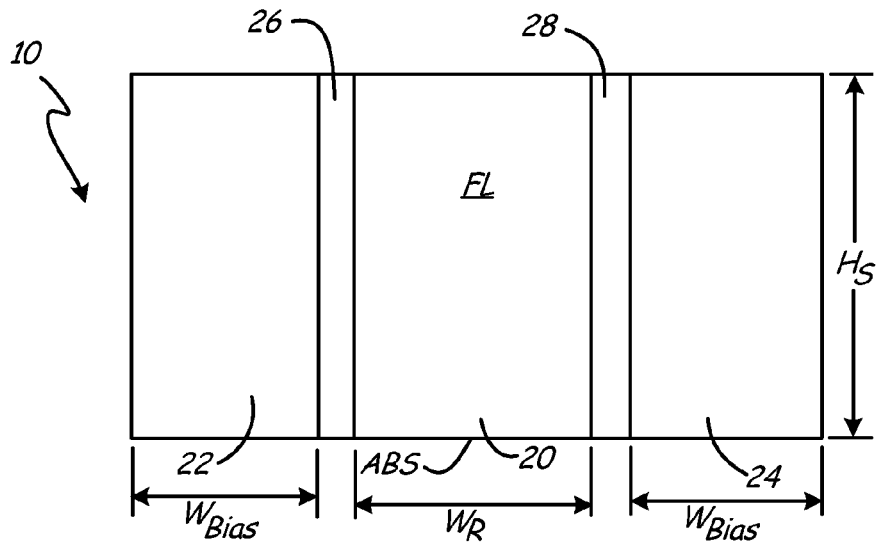
FIG. 1 is a schematic diagram of a prior art reader with rectangular bias magnets and a rectangular reader stack.

FIG. 1 shows prior art reader 10, which includes rectangular reader stack 20, rectangular bias elements 22 and 24, and nonmagnetic spacers 26 and 28. Reader stack 20 includes magnetic and nonmagnetic layers, including at least one free layer. Stack 20 has a reader width $W_R$ and a stripe height $H_S$. Each of bias elements 22 and 24 has a width $W_{Bias}$. Widths $W_R$ and $W_{Bias}$ are uniform from air bearing surface ABS to the top of reader 10. Spacers 26 and 28 are nonmagnetic, and may be, for example, metal or ceramic.

Figure 2A:
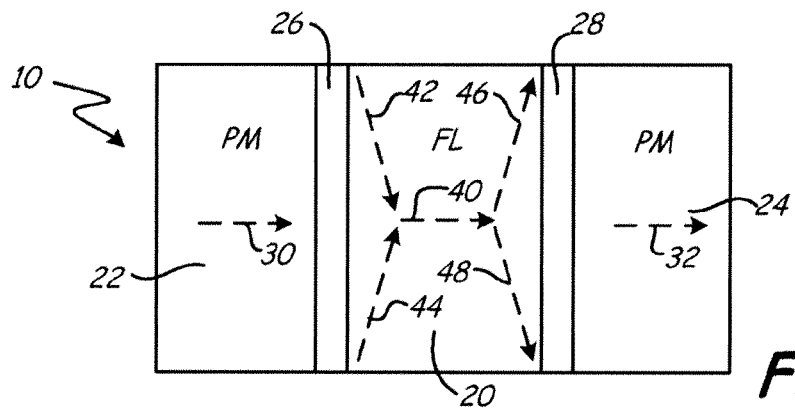
FIG. 2A is a schematic diagram showing micromagnetic magnetization patterns in a rectangular free layer of a prior art reader design.
Figure 2B:
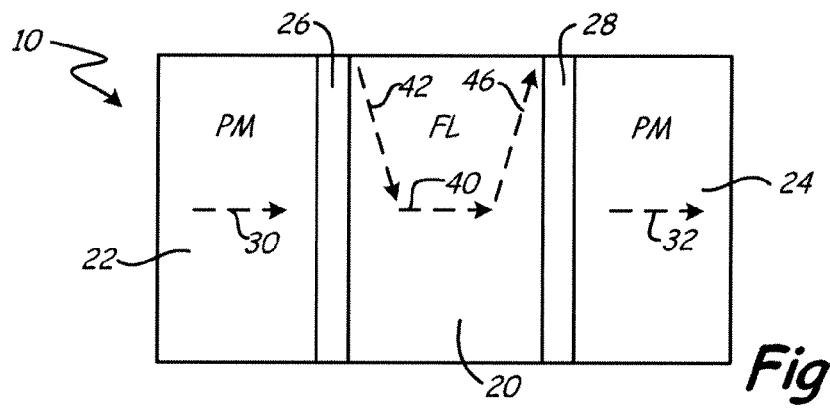
FIG. 2B is a schematic diagram showing a "C" type micromagnetic magnetization pattern.
Figure 2C:
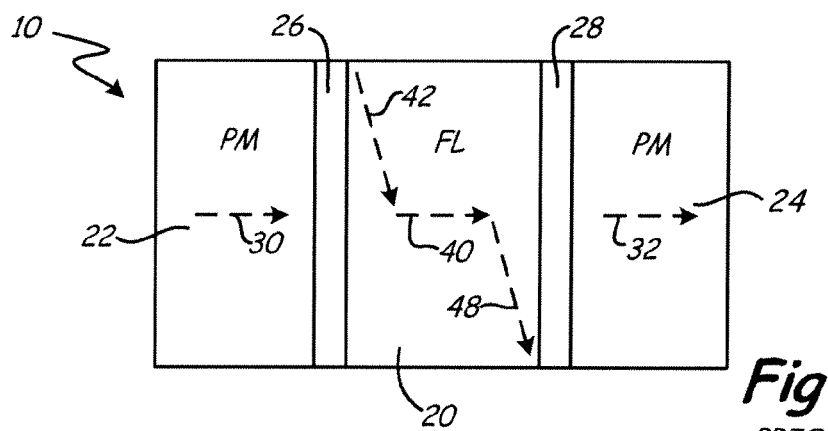
FIG. 2C is a schematic diagram showing an "S" type micromagnetic magnetization pattern.

FIG. 2A is a schematic diagram showing a top view of micromagnetic magnetization patterns in free layer FL of reader stack 20 in prior art sensor 10. Magnetization in bias elements 22 and 24 is indicated by arrows 30 and 32, respectively. Arrow 40 depicts primary magnetization in free layer FL of sensor stack 20 resulting from bias magnets 22 and 24. The micromagnetic magnetization patterns in free layer FL of sensor stack 20 are preferably parallel to the borders close to bias magnets 22 and 24 due to demagnetization effects as shown by arrows 42, 44, 46 and 48. The magnetization in free layer FL exists in two states that are energetically close and that change from one to another as a result of thermal activation. A "C" state is shown in FIG. 2B comprising magnetization vectors 40, 42 and 46. Another "C" state can be represented by vectors 44, 40 and 48. An alternate state designated an "S state", is shown in FIG. 2C comprising magnetization vectors 42, 40 and 48. Another "S" state can be represented by vectors 44, 40 and 46. Changing magnetization resulting from thermally activated fluctuations between the "C" and "S" states results in RTN noise.

The reader of the invention makes use of a non-rectangular shaped sensor stack (and free layer) and non-rectangular shaped magnetic bias elements to stabilize either the "C" shape or the "S" shape. In embodiments shown in FIGS. 3, 6A, and 6B, the inventive reader disclosed herein stabilizes the "C" state at the expense of the "S" state and minimizes RTN noise. In embodiments shown in FIGS. 7 and 8, the inventive reader stabilizes the "S" state at the expense of the "C" shape and minimizes RTN noise.

Figure 3:
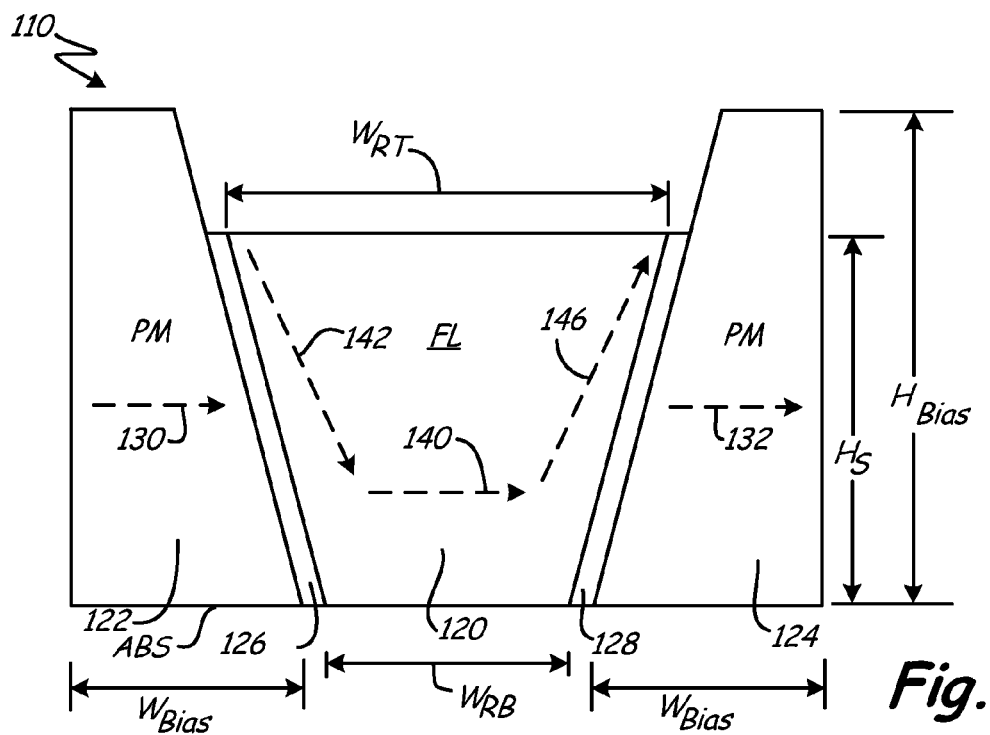
FIG. 3 is a schematic diagram showing a "C" type micromagnetization pattern in a trapezoidal free layer and bias magnets of a reader of the invention.

FIG. 3 shows reader 110, which includes sensor stack 120, permanent magnet bias elements 122 and 124, and spacers 126 and 128. Sensor stack 120 and bias elements 122 and 124 have trapezoidal shapes, that, as shown by micromagnetization vectors 142, 140 and 146 in free layer FL of sensor stack 120, stabilize the "C" state when under the influence of bias magnetization vectors 130 and 132. The dimensions of trapezoidal sensor stack 120 are reader base width $W_{RB}$, reader top width $W_{RT}$, and stripe height $H_S$. The dimensions of this aspect of the invention are base width $W_{RB}$ of about 20 nm, top width $W_{RT}$ of about 40 nm, and height $H_S$ of about 30 nm. In another aspect, reader top width $W_{RT}$ is at least 10 percent wider than reader base width $W_{RB}$.

The trapezoidal geometry shown in FIG. 3 offers an increased reader area and resulting RA product at no expense to the reader footprint at the ABS. In this aspect of the present invention, the increased width $W_{Bias}$ of trapezoidal bias elements 122 and 124 at the ABS increases the bias field in that vicinity. In another aspect, by extending the height $H_{Bias}$ of the bias magnets beyond reader stripe height $H_S$, the "C" micromagnetic magnetization pattern is enhanced and RTN noise is minimized.

Figure 4:
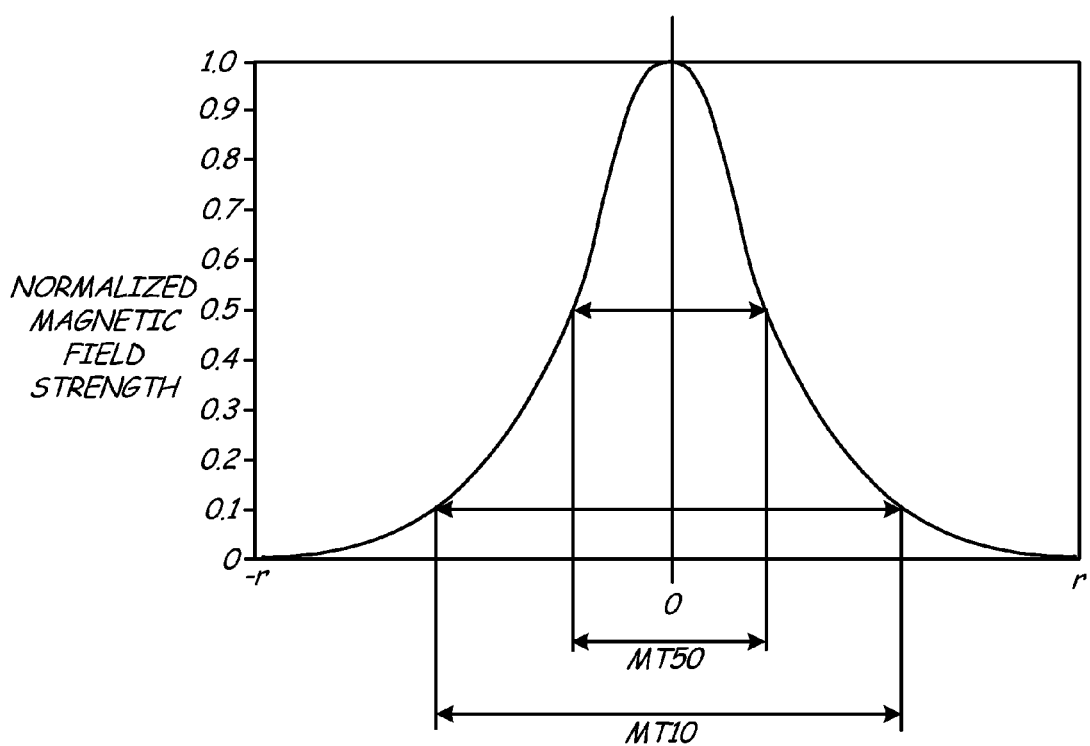
FIG. 4 is a schematic diagram illustrating the response of a MR sensor to the effect of a bit field source versus the distance of the sensor from the field source.

FIG. 4 is a plot showing the response of MR sensor 110 due to the field from a very narrow track (called micro-track) on a recording medium as a function of the distance r of sensor 110 from the bit. A normalized peak magnetic field strength detected by the sensor from the narrow track is plotted on the Y axis and the relative separation r of the sensor from the bit is plotted on the X axis. The signal is greatest when the sensor is directly on the bit at X=0. As the separation between MR sensor 110 and the bit increases, the signal strength decreases rapidly, that is, it decays. The curve is plotted to indicate a $1/r^2$ relationship between signal strength and separation r. The distance between two positions on the media, at which the signal strength decreases 50% from its maximum, is known as MT50. The distance between two positions on the media, at which the signal decreases to 10% of its maximum, is known in as MT10. The ratio MT10/MT50 is an indication of the ability of sensor 110 to detect magnetic fields from adjacent tracks that distort the sensing signal.

Figure 5:
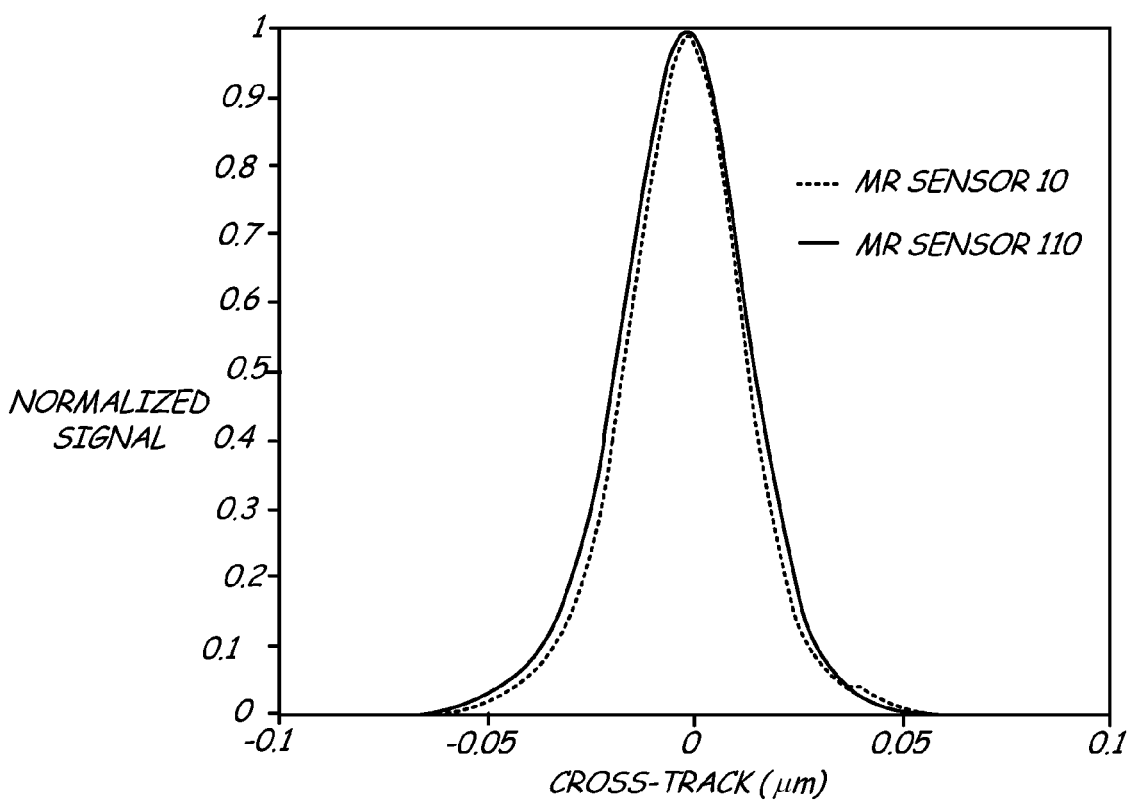
FIG. 5 is a micromagnetic simulation of the response of a prior art MR sensor and an inventive MR sensor to a bit field source versus the distance of the sensors from the field source.

Since trapezoidal sensor stack 120 is about 10% wider than rectangular sensor stack 20, it is helpful to know how the cross track signal profile changes between the two sensors. Micromagnetic modeling of cross track signal strength from the same micro-track on the two sensor geometries gave the results shown in FIG. 5. The FIG. shows signal strength as a function of distance from the micro-track center on a recording medium for sensor 10 and sensor 110. The two curves almost superimpose, indicating that increasing the top width (and area) of trapezoidal sensor 120 has not affected sensor cross-track performance. MT10/MT50 of both sensors 10 and 110 are about the same.

Figure 6A:
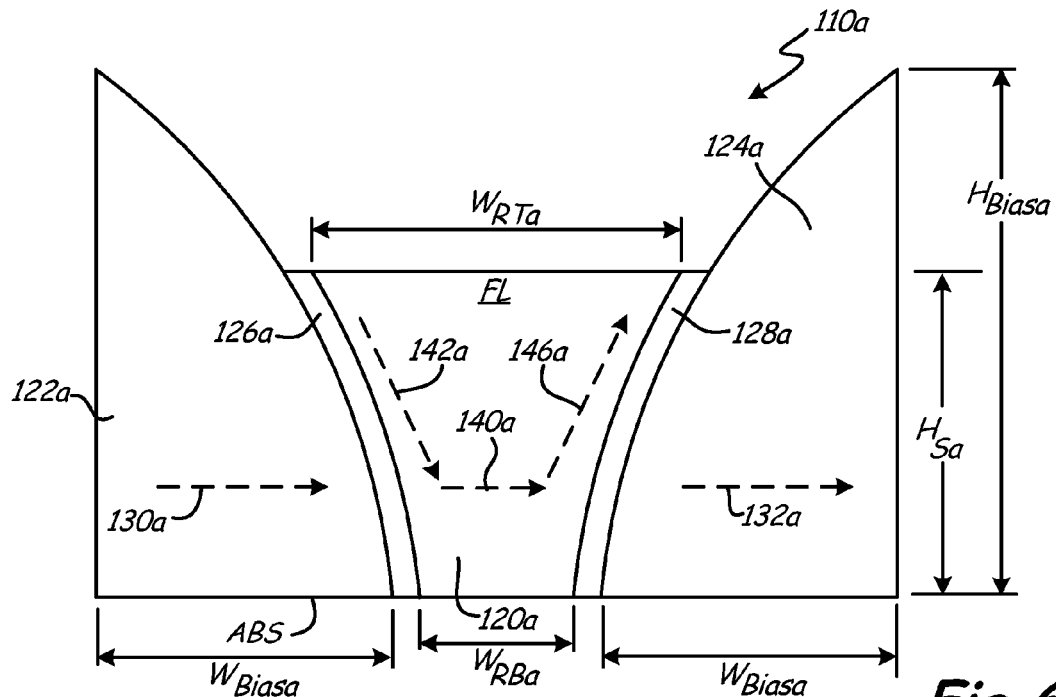
FIG. 6A is a schematic diagram showing an alternative embodiment of a reader of the invention.
Figure 6B:
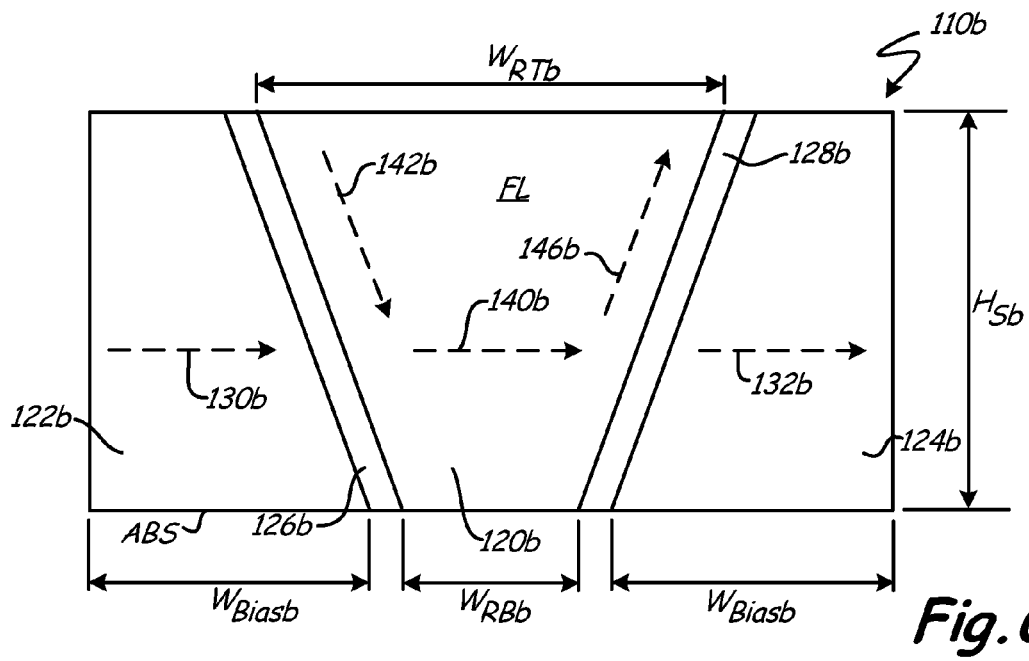
FIG. 6B is a schematic diagram showing an alternative embodiment of a reader of the invention.

FIGS. 6A and 6B are schematic illustrations of various exemplary aspects of the present reader. FIG. 6A shows reader 110a, which includes sensor stack 120a, permanent bias magnet elements 122a and 124a and spacers 126a and 128a. Sensor stack 120a and bias elements 122a and 124a have shapes that, as shown by micromagnetization vectors 142a, 140a, and 146a in free layer FL of sensor stack 120a, stabilize the "C" state when under the influence of bias magnetization vectors 130a and 132a. In one embodiment the sensor stack and permanent bias magnets are curved designs. The dimensions of sensor stack 120a are reader base width $W_{RBa}$, reader top width $W_{RTa}$ and stripe height $H_{Sa}$. The dimensions of this aspect of the invention are base width $W_{RBa}$ of about 20 nm, top width $W_{RTa}$ of about 40 nm, and height $H_{Sa}$ of about 30 nm. In another aspect, reader top width $W_{RTa}$ is at least 10 percent wider than reader base width $W_{RBa}$.

The geometry shown in FIG. 6A offers an increased reader area and resulting RA product at no expense to the reader footprint at the ABS. In this embodiment, the increased width, $W_{Biasa}$ of bias elements 122a and 124a at the ABS increases the bias field in that vicinity. In another aspect, by extending the height $H_{Biasa}$ of the bias magnets beyond the reader stripe height $H_{Sa}$, a "C" micromagnetization pattern is enhanced and RTN noise is minimized.

FIG. 6B shows reader 110b, which includes sensor stack 120b, permanent magnet bias elements 122b and 124b and spacers 126b and 128b. Sensor stack 120b and bias elements 122b and 124b have shapes that, as shown by micromagnetization vectors 142b, 140b and 146b in free layer FL of sensor stack 120b, stabilize the "C" state when under the influence of bias magnetization vectors 130b and 132b. The dimensions of sensor stack 120b are reader base width $W_{RBb}$, reader top width $W_{RTb}$ and stripe height $H_{Sb}$. The dimensions of this aspect of the invention are base width $W_{RBb}$ of about 20 nm, top width $W_{RTb}$ of about 40 nm, and height $H_{Sb}$ of about 30 nm. In another aspect, reader top width $W_{RTb}$ is at least 10 percent wider than reader base width $W_{RBb}$. The geometry shown in FIG. 6B offers an increased reader area and resulting RA product at no expense to the reader footprint at the ABS. In this embodiment, the increased width $W_{Biasb}$ of bias elements 122b and 124b at the ABS increases the bias field in that vicinity.

Figure 7:
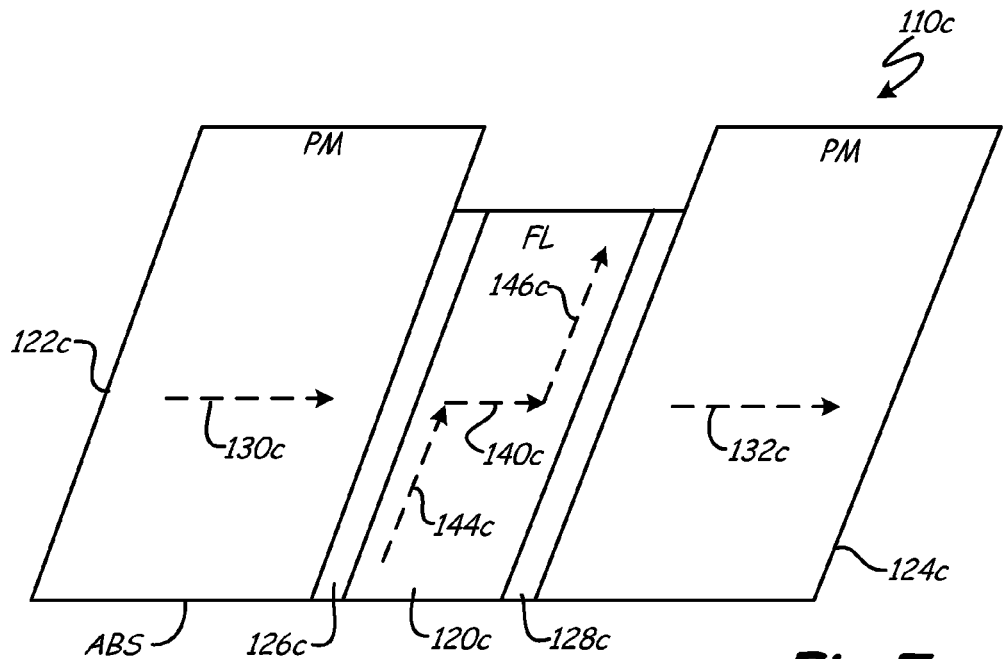
FIG. 7 is a schematic diagram of an embodiment of the reader of the invention having a non-rectangular parallelogram free layer and non-rectangular parallelogram bias magnets.
Figure 8:
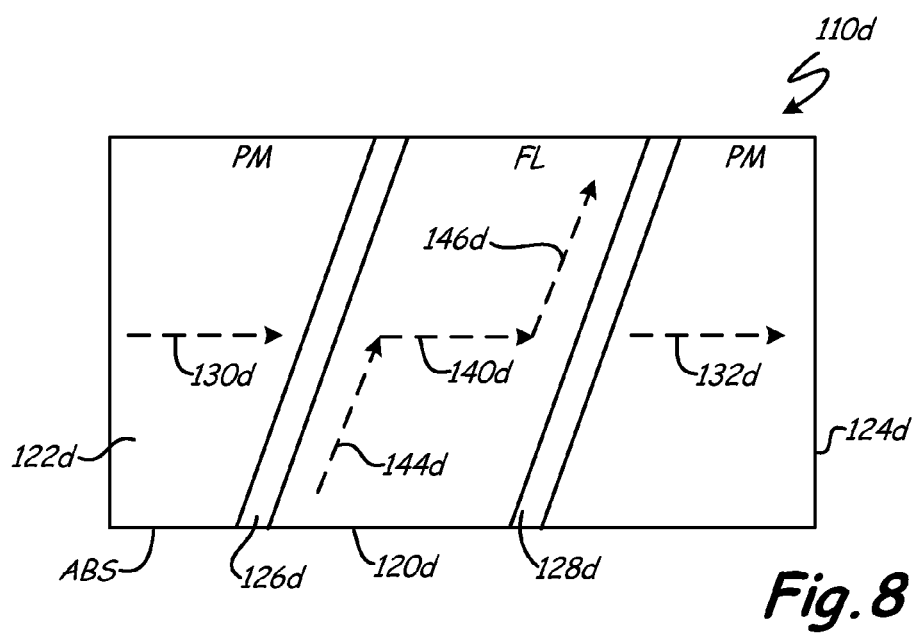
FIG. 8 is a schematic diagram of an embodiment of the reader of the invention having a non-rectangular parallelogram free layer and trapezoidal bias magnets.

FIGS. 7 and 8 are schematic illustrations of two alternative aspects of the inventive reader that make use of a non-rectangular parallelogram sensor stack (and free layer) to stabilize the "S" shape at the expense of the "C" shape. FIG. 7 shows reader 110c, which includes sensor stack 120c, permanent bias magnet elements 122c and 124c and spacers 126c and 128c. Sensor stack 120c and bias elements 122c and 124c have parallelogram shapes that, as shown by micromagnetization vectors 144c, 140c, and 146c in free layer FL of sensor stack 120c, stabilize the "S" state when under the influence of bias magnetization vectors 130c and 132c. In this embodiment the adjacent sides of bias element 122c and sensor stack 120c are parallel to one another and separated by spacer 126c. Similarly, the adjacent sides of sensor stack 120c and bias element 124c are parallel to one another and separated by spacer 128c.

As illustrated in FIG. 7, the width of sensor stack 120c is less than the widths of bias elements 122c and 124c. In other embodiments, the relative widths may differ.

In FIG. 7 the height of bias elements 122c and 122d is greater than the reader stripe height of sensor stack 120c. This helps to enhance a "S" micromagnetization pattern and reduce RTN noise.

FIG. 8 shows reader 110d, which includes sensor stack 120d, permanent magnet bias elements 122d and 124d and spacers 126d and 128d. Sensor stack 120d has a non-rectangular parallelogram shape, while bias elements 122d and 124d have trapezoidal shapes. As shown by micromagnetization vectors 144d, 140d and 146d in free layer FL of sensor stack 120d, these shapes stabilize the "S" state when under the influence of bias magnetization vectors 130d and 132d. Bias elements 122d and 124d have the same shape, but bias element 124d is inverted with respect to bias element 122d. In other words, bias elements are arranged in a reciprocal relationship. The base of bias element 122d of the ABS is smaller than the base of bias element 124d. The right side of bias element 122d is parallel to and spaced from the left side of sensor stack 120*d* by spacer 126*d*. Similarly, the left side of bias element 124*d* is parallel to and spaced from sensor stack 120*d* by spacer 128*d*.

Both the embodiments with a substantially trapezoidal sensor stack (FIGS. 3, 6A, and 6B) and the embodiments with a non-rectangular parallelogram sensor stack (FIGS. 7 and 8) help to reduce magnetic noise by stabilizing, either the "C" state or the "S" state. The trapezoidal sensor stack embodiments also help to reduce electronic noise, reduce resistance and resistance distribution. The parallelogram sensor stack embodiments offer advantages of easier fabrication, and will not increase reader width distribution.

While the disclosure has been described with reference to an exemplary embodiment(s), it will be understood by those skilled in the art that various changes may be made and equivalents may be substituted for elements thereof without departing from the scope of the discussed technology. In addition, many modifications may be made to adapt a particular situation or material to the teachings of the embodiments without departing from the essential scope thereof. Therefore, it is intended that the present disclosure not be limited to the particular embodiment(s) disclosed, but that the invention will include all embodiments falling within the scope of the appended claims.

The invention claimed is:

1. An apparatus comprising:
   a sensor stack having a first side with an overall first width in facing relation to an air bearing surface (ABS), an opposing second side with an overall second width greater than the first width, and an overall stack height extending between the first and second sides that is greater than the first width; and
   first and second bias elements respectfully positioned on opposing third and fourth sides of the sensor stack, at least one bias element having a non-rectangular cross-sectional shape in a plane perpendicular to the ABS.

2. The apparatus of claim 1 wherein the second width is at least about 10% greater than the first width.

3. The apparatus of claim 2 wherein the sensor stack is a current perpendicular to plane (CPP) stack.

4. The apparatus of claim 1 further comprising first and second spacer layers respectively separating the first and second bias elements from the sensor stack.

5. The apparatus of claim 1 wherein the first and second bias elements are permanent magnets.

6. The apparatus of claim 1 wherein the stack height is less than the second width.

7. The apparatus of claim 1, in which the first and second bias elements each have a trapezoidal cross-sectional shape.

8. The apparatus of claim 1, in which the first bias element exerts a first magnetization in a direction toward the sensor stack along the ABS and the second bias element exerts a second magnetization in a direction away from the sensor stack along the ABS to stabilize a "C" shaped magnetization pattern through the sensor stack.

9. An apparatus comprising a magnetoresistive stack positioned between first and second bias elements on an air bearing surface (ABS), wherein the magnetoresistive stack has a sensor sidewall extending from the ABS at a predetermined angle non-orthogonal to the ABS and at least one bias element of the first and second bias elements has a biasing sidewall extending from the ABS substantially parallel to the sensor sidewall to provide the at least one bias element with a trapezoidal cross-sectional shape in a plane perpendicular to the ABS, the apparatus further comprising first and second spacer layers respectively interposed between the first and second bias elements and the magnetoresistive stack, each of the first and second bias elements respectively having a first side with an overall first width in facing relation to the ABS and an opposing second side with an overall second width less than the first width.

10. The apparatus of claim 9 wherein the first and second bias elements are permanent magnets.

11. The apparatus of claim 9 wherein a first distance from the ABS to a top of the first and second bias elements is greater than a second distance from the air bearing surface to a top of the magnetoresistive stack.

12. The apparatus of claim 9, in which the first bias element exerts a first magnetization in a direction toward the magnetoresistive stack along the ABS and the second bias element exerts a second magnetization in a direction away from the magnetoresistive stack along the ABS to stabilize a "C" shaped magnetization pattern through the magnetoresistive stack.

13. The apparatus of claim 9, in which the magnetoresistive stack has a first side with an overall first width in facing relation to the ABS and an opposing second side with an overall second width greater than the first width of the first side of the magnetoresistive stack.

14. An apparatus comprising:
   a magnetically responsive sensor having a first surface aligned along an air bearing surface (ABS) with an overall first width, a second surface opposite and parallel to the first surface with an overall second width greater than the first width, and an overall height between the first and second surfaces greater than the first width; and
   first and second bias elements arranged on opposing sides of the sensor along the ABS, each of the first and second bias elements having a trapezoidal cross-sectional shape in a plane perpendicular to the ABS.

15. The apparatus of claim 14 wherein the height is less than the second width.

16. The apparatus of claim 14 wherein a first distance from the ABS to a top of the first and second bias elements is greater than a second distance from the air bearing surface to a top of the sensor.

* * * * *